United States Patent [19]
Malhi et al.

[11] Patent Number: 5,717,241
[45] Date of Patent: *Feb. 10, 1998

[54] GATE CONTROLLED LATERAL BIPOLAR JUNCTION TRANSISTOR

[75] Inventors: Duljit S. Malhi, Nepean; M. Jamal Deen, Coquitlam; William Kung, Ottawa; John Ilowski, Nepean; Stephen J. Kovacic, Kanata, all of Canada

[73] Assignee: Northern Telecom Limited, Montreal, Canada

[*] Notice: The term of this patent shall not extend beyond the expiration date of Pat. No. 5,498,885.

[21] Appl. No.: 310,003

[22] Filed: Sep. 20, 1994

Related U.S. Application Data

[63] Continuation-in-part of Ser. No. 163,636, Dec. 9, 1993, abandoned.

[51] Int. Cl.⁶ .................. H01L 29/76; H01L 29/80; H01L 29/94
[52] U.S. Cl. .................. 257/378; 257/273; 257/408
[58] Field of Search .................. 257/256, 262, 257/265, 272, 273, 378

[56] References Cited

U.S. PATENT DOCUMENTS

| | | | |
|---|---|---|---|
| 4,344,081 | 8/1982 | Pao et al. | 257/378 |
| 4,669,177 | 6/1987 | D'Arrigo et al. | 29/571 |
| 4,800,415 | 1/1989 | Simmons et al. | 357/34 |
| 5,250,826 | 10/1993 | Chang et al. | 257/273 |
| 5,498,885 | 3/1996 | Deen et al. | 257/378 |

FOREIGN PATENT DOCUMENTS

| | | | |
|---|---|---|---|
| 62-169890 | 6/1987 | Japan | H01L 29/72 |
| 61-137523 | 12/1987 | Japan | 257/378 |

*Primary Examiner*—Wael Fahmy
*Attorney, Agent, or Firm*—Angela C. de Wilton

[57] ABSTRACT

A gate controlled lateral bipolar junction transistor (GCLBJT) device for an integrated circuit and a method of fabrication thereof are provided. The GCLBJT resembles a merged field effect transistor and lateral bipolar transistor, i.e. a lateral bipolar transistor having base, emitter and collector terminals and a fourth terminal for controlling a gate electrode overlying an active base region. The device is operable as an electronically configurable lateral transistor. Advantageously a heavily doped buried layer provides a base electrode having a base contact which surrounds and encloses the collector. The surface region between emitter and collector is characterized by lightly doped regions adjacent and contiguous with the heavily doped emitter and collector, which effectively reduce the base width of the bipolar transistor and improve operation for analog applications.

8 Claims, 8 Drawing Sheets

GATE CONTROLLED LATERAL BIPOLAR JUNCTION TRANSISTOR

FIELD OF THE INVENTION

This is a Continuation-In-Part of U.S. patent application Ser. No. 08/163,636 filed Dec. 9, 1993, now abandoned, in the name of D. S. Malhi, et al and entitled "Semiconductor Device for Integrated Circuit" and relates to a gate controlled lateral bipolar junction transistor (GCLBJT) and a method of fabrication thereof.

BACKGROUND OF THE INVENTION

In designing integrated circuits using known technologies, circuit designers have access to limited set of transistors. That is, the design parameter space available is defined by the choice of field effect transistors (FETs) and bipolar transistors offered by the technology.

In VLSI and ULSI technology using silicon semiconductor substrates, complementary metal oxide semiconductor (CMOS) transistors, or MOSFETs are typically used. The integration of CMOS transistors with bipolar transistors to provide Bipolar-CMOS (BiCMOS) VLSI integrated circuits is now well established. BiCMOS circuits provide advantages such as high speed, high drive, mixed voltage performance with analog-digital capabilities, which are beneficial in applications such as telecommunications. However, there is considerable challenge in optimizing the performance of both CMOS and bipolar devices fabricated with progressively reduced dimensions. In order to fabricate an integrated circuit combining both bipolar transistors and field effect transistors on the same chip, compromises must be made during both design and fabrication to optimize performance of both bipolar and field effect transistors, without inordinately increasing the number of processing steps.

The design stage is critical to the device characteristics both in defining both the physical structure of the device and the integrated circuit layout. Device parameters for both bipolar transistors and FETs, are primarily set during design, i.e. by the device structure, including critical dimensions, e.g. base width of a bipolar transistors, and correspondingly, a channel length of a FET. The latter dimensions influence characteristics such as base transport time, base resistance, and parasitic capacitances, resistances, etc. Furthermore a design must accommodate acceptable variances in fabrication processes and materials to obtain a manufacturable process with high yield.

Several device structures are known which combine elements of both bipolar and field effect type devices in a single device, and seek to provide improved characteristics relative to individual FET and bipolar devices. For example, Pao in U.S. Pat. No. 4,344,081 discloses a combined DMOS FET and vertical bipolar transistor. The device comprises a bipolar transistor structure with a gate electrode to provide a bipolar device having a much lower ON resistance than a unipolar MOS device, thus reducing latchback. A bipolar inversion channel device called a BICMET comprising a source, emitter and collector is described by Simmons in U.S. Pat. No. 4,800,415 to provide improved gain and transconductance over a conventional vertical bipolar transistor.

Another device is described in U.S. Pat. No. 4,669,177 to D'Arrigo takes the form of a lateral bipolar transistor having gate electrodes provided over the base regions. The gate electrodes are connected to the emitter to bias the parasitic surface MOSFET off. As noted by D'Arrigo, the performance of the lateral transistor is strongly dependent on parasitic transistor effects, i.e. of both lateral and vertical parasitic transistors. Improved performance requires optimizing the lateral bipolar transistor efficiency vs. that of the parasitic vertical bipolar transistor. D'Arrigo does so by maximizing the planar area relative to the perimeter of the device. To reduce leakage and optimize performance as a digital device, it is formed on a p-epi layer. However, the resulting device therefore has a relatively high base resistance, which is not desirable for operation as an analog device.

Similarly, in Japanese Patent Application No. 61-137523, Takeda describes a semiconductor integrated circuit in which the current amplification of a lateral bipolar transistor is improved by providing "emitter-over-oxide" electrodes, that is, gate type electrodes extending over a base region between the collector and emitter region of a lateral transistor. The gate electrodes are tied to the emitter, so that as in D'Arrigo's structure, the gate electrode effectively turns off the parasitic MOS channel and reduces surface effects. Takeda uses a heavily doped buried layer to provide a lower resistance base. Another Japanese Patent Application 62-169890 to Maeda entitled "Semiconductor Element" describes several other configurations of merged lateral bipolar transistor and FET structures formed on an n-epilayer, including a four terminal device in which a separate gate terminal is provided for executing control of the base current to obtain a higher input impedance.

SUMMARY OF THE INVENTION.

The present invention seeks to provide a gate controlled lateral bipolar junction transistor device for an integrated circuit, and a method of fabrication thereof, which avoid or reduce the above mentioned problems, and provide improved analog performance.

Thus according to one aspect of the present invention there is provided a gate controlled lateral bipolar junction transistor for an integrated circuit comprising:

a substrate comprising a layer of semiconductor material of a first conductivity type having a surface, and an underlying heavily doped semiconductor layer of the first conductivity type;

first and second laterally spaced apart regions of a second conductivity type defined in the surface of the semiconductor layer and forming an emitter and a collector of the transistor, part of the layer of semiconductor material of the first conductivity type extending laterally between the emitter and the collector and forming a base region of the transistor, and lightly doped regions of the second conductivity type being provided in parts of the surface between emitter and collector, adjacent and contiguous with adjacent the emitter and collector regions;

a gate electrode formed on the surface of the substrate overlying the base region and isolated therefrom by a gate dielectric; and the heavily doped buried layer of said first conductivity type extending under the emitter, base and collector regions and forming a buried base electrode with a heavily doped base contact extending from the surface to the buried layer;

first, second and third terminals being provided to the emitter, base and collector, for operation of the device as a bipolar transistor, and a fourth terminal being provided to the gate electrode for controlling surface inversion of a surface MOSFET channel provided by the base region under the gate electrode between emitter and collector regions, thereby providing for concurrent control of both field effect and bipolar injection phenomena in the base region during operation of the transistor with a potential on the gate electrode, for controlling a current path of minority carriers through the base region.

Thus a four terminal, gate controlled bipolar transistor is provided having emitter, collector, base and gate terminals. Advantageously, the base electrode is provided by a heavily doped buried layer, with a base contact in the form of a conductive plug (i.e. a sinker) contacting the buried layer. Preferably, a heavily doped buried layer and a sinker (i.e. base contact) with an enclosed form helps in significantly reducing the DC gain of the sideways parasitic bipolar transistor and parasitic vertical transistor.

For example, in a pnp type lateral bipolar transistor, an $n^+$ buried layer and sinker having an enclosed form helps in isolation of the substrate and the lateral pnp. This structure also aids in reducing the base resistance (extrinsic) of the lateral bipolar pnp transistor.

Advantageously, the surface of the base region under the gate electrode is selectively doped with a threshold adjust implant so that the threshold voltage of the MOSFET channel can be controlled very precisely. Moreover, shallow lightly p-doped surface regions are provided in the surface region, adjacent and contiguous with the emitter and collector. These lightly doped regions are similar to LDD (lightly doped drain) regions typical of MOSFETs fabricated with LDD technology. Both the latter features are compatible with advanced CMOS/BiCMOS fabrication, and significantly improve the performance of the GCLBJT device, i.e. by improving the short channel effects, and providing a smaller effective channel length. Since the base width of a conventional LBJT is constrained to be larger than the minimum linewidth for the technology, the shallow lightly p-doped regions adjacent the emitter and collector reduce. the effective base width of the lateral PNP, with significantly improved performance. Furthermore, this structure also improves the operation of the gate electrode to control surface inversion effects for operation of the GC-LBJT device as a four terminal device, i.e. as a gate controlled device.

These factors together have the effect that this technology is well suited for analog applications. Use of the fourth gate terminal provides for reduced noise, and variable current gain over a wide range compared to known prior art transistor devices which combine bipolar and field effects.

According to another aspect of the present invention there is provided a gate controlled lateral bipolar junction transistor comprising:

a substrate comprising a surface layer of a semiconductor of a first conductivity type having formed thereunder a heavily doped buried layer of said first conductivity type forming a buried base electrode, and a contact provided to the buried base electrode through the surface layer;

an emitter region and a collector region of a second conductivity type defined in the surface layer of the substrate overlying the base electrode, the emitter and collector regions being laterally spaced apart with an intervening region of the first conductivity type forming an active base region;

a gate electrode formed on the surface of the substrate over the active base region, and isolated therefrom by a layer of a gate dielectric;

first and second terminals being provided respectively to the emitter region and collector region, and third terminal to a surface contact to the buried layer, for operation of the structure as a bipolar transistor, and, a fourth terminal being provided to the gate electrode for application of a potential for controlling field inversion in a MOS channel region formed in the surface under the gate electrode between emitter and collector regions;

thereby providing for concurrent control of both field effect and bipolar, injection phenomena during operation of the transistor with a potential on the gate electrode for modifying the path of collector current through the base region during operation of the device as a bipolar transistor, whereby field effect and bipolar injection phenomenon are controlled concurrently;

the base region under the gate electrode being characterized by a selectively doped very shallow surface region for controlling the threshold voltage of the MOS channel region; and shallow relatively lightly doped regions of a second conductivity type being provided in the surface region adjacent and contacting the emitter and collector regions to reduce both the effective base width and MOS channel length of the transistor.

That is, a gate controlled lateral bipolar junction transistor is provided having four terminals, the fourth terminal, i.e. to the gate electrode, controls the conduction path between emitter and collector of the transistor. Preferably the device has a collector region with an annular form surrounding the emitter region. Advantageously the base contact is also of annular form to form an enclosed structure with the buried layer.

Thus according to another aspect of the present invention there is provided method of operating a gate controlled lateral bipolar junction transistor having an emitter region, a collector region, an intervening base region, and a gate electrode overlying the base region and isolated from the base region by a gate dielectric layer, comprising:

during operation of the device as a bipolar transistor, modulating the current path in the base region between the emitter and collector by application of a potential on the gate electrode to control field inversion in the base region extending between the emitter and the collector and underlying the gate, thereby concurrently controlling both field effect and bipolar injection phenomenon.

In particular during operation of the device in a grounded base configuration, if the threshold voltage is set to zero volts, a potential is required on the gate to turn off the surface MOS channel. A positive bias on the gate drives free holes from the interface between gate oxide and silicon surface, and thereby destroys the low conductivity path between emitter and collector. The lateral bipolar transistor can then operate in a conventional manner with no regard to MOSFET behavior. With larger positive potential on the gate, the path taken by holes injected from the emitter moves deeper into the bulk of the silicon under the gate. In effect, the lateral bipolar transistor properties and performance metrics, which are dependent upon the path of minority carriers, are thus also dependent upon the gate bias.

Consequently, a number of transistor parameters are affected by gate bias. These include bipolar transistor gain, frequency response, and noise properties.

A grounded base configuration provides controllable, high gain, good transconductance for analog applications, and low base resistance. Thus the fourth electrode provides for modification of the current voltage characteristics by varying the current gain. Surface effects are controlled and low noise can be obtained compared with known devices which combine elements of both FET and bipolar devices.

Alternatively the device may be operated in a grounded emitter mode.

Thus the present invention provides a gate controlled lateral bipolar junction transistor GC-LBJT device for an integrated circuit. The device takes the form of an electronically re-configurable lateral transistor having elements resembling a lateral bipolar transistor and including a fourth electrode for controlling the transport properties of minority carriers between the emitter and the collector. The four terminal GCLBJT device operates similarly to a merged bipolar and field effect transistor, which combines both field effect and bipolar injection phenomenon concurrently within the same device, to yield the salient device characteristics.

Features including an LDD like doping profile in the base region, and a buried base contact provide for improved gain and noise characteristics for analog application compared with other known 4 terminal devices combining FET/Bipolar effects.

According to another aspect of the present invention there is provided a method of fabricating a gate controlled lateral bipolar junction transistor, comprising:

providing a substrate comprising a semiconductor layer of a first conductivity type having a surface, and an underlying heavily doped buried layer of the first conductivity type;

providing a base contact through the semiconductor layer to part of the buried layer to define a buried base electrode;

providing a layer of a gate dielectric material and an overlying layer of conductive material on the surface and patterning to define a gate electrode overlying a part of the substrate surface which defines a base region of the first conductivity type;

selectively doping surface regions of the substrate adjacent the gate electrode to define shallow, lightly doped regions of a second conductivity type;

forming dielectric sidewall spacers on sidewalls of the gate electrode;

selectively doping surface regions adjacent the sidewall spacers of the gate electrode to define heavily doped regions of the second conductivity type forming emitter and collector regions;

the surface region underlying the sidewall spacers thereby being characterized by relatively lightly doped regions adjacent and contiguous with the heavily doped emitter and collector regions of the second conductivity type, and the base region of the first conductivity type extending therebetween;

and then, forming electrical contacts to the emitter region, collector region, and base contact for operation of the device as a conventional bipolar transistor, and forming a fourth contact to the gate electrode, for operating the semiconductor device as a gate controlled lateral bipolar transistor with concurrent control of both field effect and bipolar injection phenomenon.

Advantageously, before forming the gate electrode the surface layer is selectively doped with a threshold adjust implant.

Thus the semiconductor device structure may be fabricated using standard CMOS/BiCMOS process technology. Through careful layout considerations, a four terminal gain device according to the invention may be fabricated in a BiCMOS process typically used for a conventional 3 terminal FET or bipolar transistor, without incorporating additional processing steps.

BRIEF DESCRIPTION OF THE DRAWINGS

Embodiments of the invention will now be described by way of example, with reference to the accompanying drawings, in which.

DESCRIPTION OF THE PREFERRED EMBODIMENTS

Figure 1:
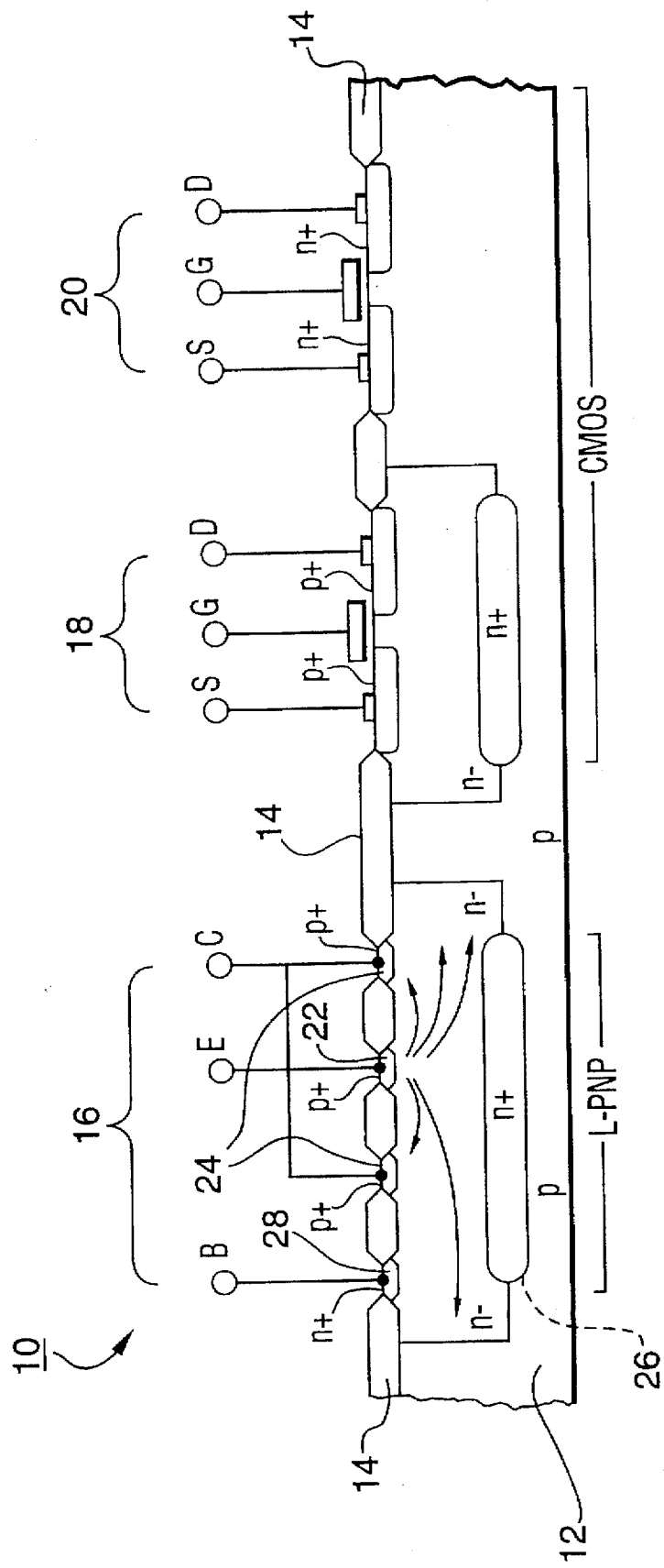
FIG. 1 shows a cross sectional view of part of a conventional prior art integrated circuit including a lateral bipolar transistor and CMOS transistors.

Part of a known prior art BiCMOS integrated circuit 10 formed on a semiconductor substrate, i.e. part of a silicon wafer 12, is shown in FIG. 1. Openings through a field oxide layer 14 define device well regions of the substrate, in which are formed a conventional PNP lateral bipolar transistor structure 16, and conventional CMOS transistors 18 and 20. The lateral bipolar transistor 16 comprises and emitter region 22, an annular collector region 24 surrounding the emitter 22, and a buried base electrode 26 with a base contact 28 at the surface. When current from the emitter 22 is launched in all directions, as shown schematically by the arrows, although the annular collector 24 surrounds the emitter 22, a significant proportion of the current may be lost to the substrate. Consequently, the lateral bipolar transistor efficiency is poor.

Figure 2:
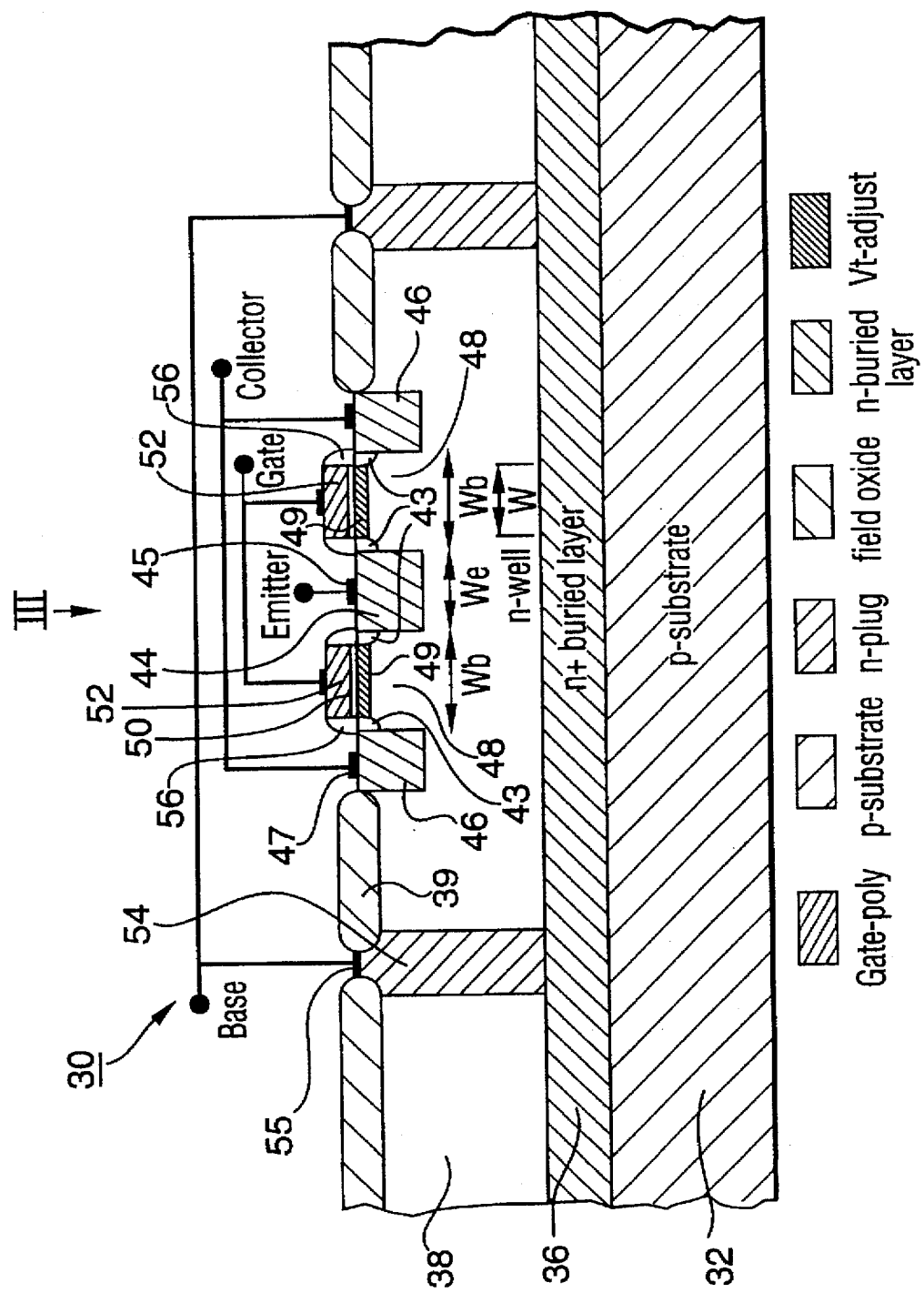
FIG. 2 shows schematic cross-sectional view of through part of an integrated circuit device fabricated showing a semiconductor device according to a first embodiment of the present invention.

Part of an integrated circuit which comprises a gate controlled lateral bipolar transistor (GCLBJT) 30 according to a first embodiment of the present invention is shown in FIG. 2. The GCLBJT 30 is formed on a silicon substrate 32, e.g. a conventional p type silicon semiconductor wafer, in which is defined a heavily doped $N^+$ buried layer 36, incorporated in a conventional manner for BiCMOS integrated circuit manufacturing. About 500Å–2000Å of a layer 38 of lightly n doped epitaxially grown material is provided over layer 36. Laterally spaced apart, heavily $P^+$ doped regions are defined to provide an emitter region 44 and an annular collector region 46 surrounding the emitter. Part of the n-doped well region 48 extends between the emitter and collector and forms the active base of the device. Other heavily doped regions 54 are provided to form contacts, or sinkers, which extend through the n well layer 38 to contact the heavily doped buried layer 36 which forms a base electrode. A thin oxide layer 50 is provided on the surface of base region 48, and forms a gate isolation oxide, and an overlying conductive layer forms a fourth electrode 52, i.e. a gate electrode, which is also of an annular configuration, overlying the active base region 48, and extending between the emitter and collector regions. Dielectric sidewall spacers 56 isolate the sides of the gate electrode 52 from adjacent regions. Thus it will be seen that the heavily doped regions 44 and 46 forming the emitter and collector of the lateral bipolar transistor also function as source and drain regions of a surface MOSFET having a MOS channel in the base region 48 controlled by the gate electrode 52.

Parts of the region 48 forming the base are selectively doped adjacent the heavily p-doped emitter and collector regions to form relatively shallow and lightly p-doped regions 43. The surface region 49 of the base region 48 is also selectively doped with a light p implant to control the threshold voltage of the MOS channel formed under the gate electrode 52 between the emitter and collector. Thus the doping profile in the base region between the emitter and collector is similar to that of a MOSFET formed with a threshold adjust ($V_t$) implant and LDD (lightly doped drain) technology. The threshold adjust implant controls the voltage at which the surface MOSFET channel turns on, and the lightly doped regions 43 also influence the characteristics of the MOS channel. The lightly doped p-regions 43 adjacent the emitter 44 and collector 46 thus extend the emitter and collector regions into the surface of the base region, and thus function to reduce the effective base width $Wb_{eff}$ of the lateral bipolar transistor.

Figure 3:
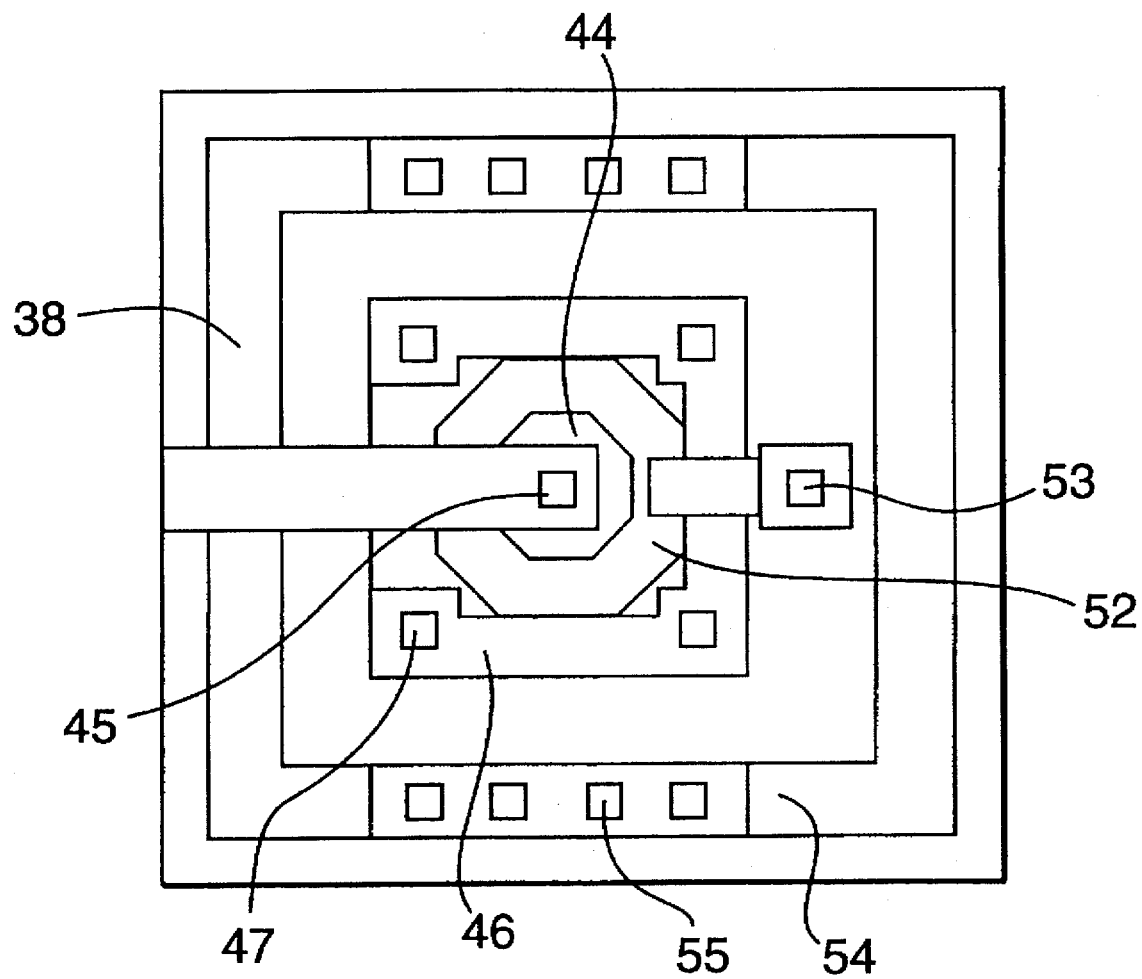
FIG. 3 shows a schematic plan view along arrow III of FIG. 3, to a different scale.

As can be seen from FIG. 3 showing a top plan view of the structure of FIG. 2, the base contact 54, to the buried base layer, encircles the collector 46 which surrounds the emitter 44 and intervening active base region 48 (shown in FIG. 2). Conductive terminal contacts 45, 47 and 55 are provided respectively to the emitter 44, collector 46 and base 54, and a separate terminal 53 is provided to the gate electrode for operation of the device as a gate controlled lateral bipolar transistor as will be discussed below.

Thus the resulting semiconductor device can be viewed as a four terminal gain device resembling a lateral transistor comprising emitter, base and collector regions with the fourth electrode acting as a gate electrode for controlling the path of collector current through the base region.

Alternatively the device can be seen as a field effect transistor having source, channel and drain regions, with an additional buried electrode controlling a base region which is located between the source and drain in the channel region. The source and drain junctions to the substrate act as the emitter and collector, respectively to form a lateral pnp bipolar transistor. The terminal which makes contact to the gate of the PMOS now becomes the terminal which controls the operating characteristics of the lateral pnp transistor. The collector/drain is configured in annular form around the source/emitter region, e.g. a ring, octagonal, diamond or rectangular form, completely surrounding the emitter and gate. Any enclosed geometry is suitable for the described lateral pnp device. Part of the n-well on top of an $n^+$ buried layer provides the transistor base. An $n^+$ diffusion makes contact to the base layer from the top surface of the wafer.

The complete device is fabricated in an n-well region having a buried layer using processing steps similar to those for a PMOS transistor.

Clearly, a complementary npn device may be fabricated with structures of the opposite conductivity type, i.e. using a n-substrate having a $p^+$ buried layer forming the a buried base electrode, and $p^+$ base contacts, and heavily n doped emitter and collector regions.

Practically, the gate controlled lateral bipolar junction transistor structure 30 is fabricated in a standard CMOS/BiCMOS technology through careful layout consideration, and without incorporating additional processing steps. As an example, a method of forming the device structure 30 is now described.

Figure 4:
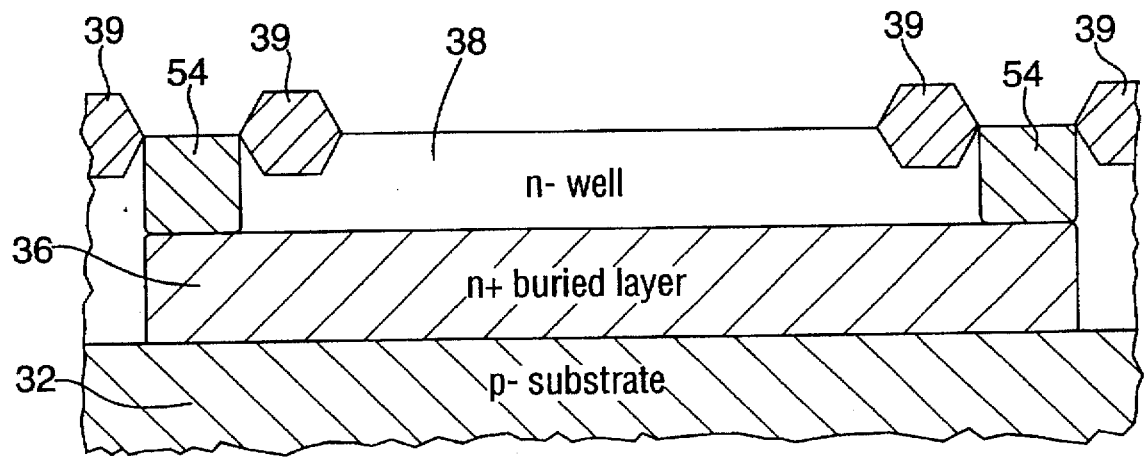
FIGS. 4 to 9 shows schematic cross sectional view through part of the integrated circuit of FIG. 1 at successive stages during fabrication.
Figure 5:
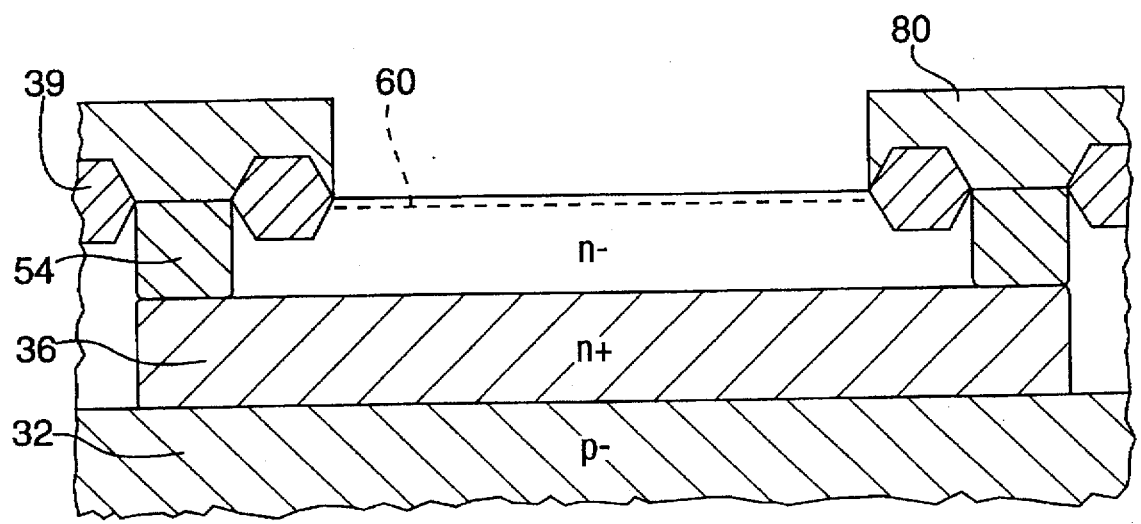
Figure 6:
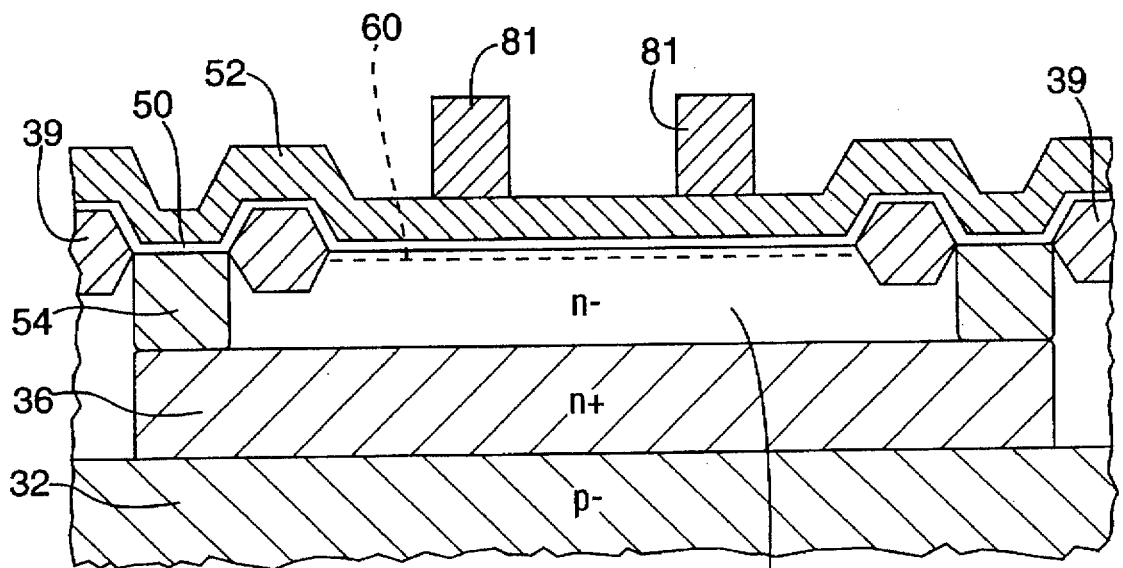

In a method of fabricating a GCLBJT device structure 30 according to the first embodiment, a conventional p type (15 $\Omega$cm) <100> silicon substrate wafer, is provided, part of which is shown in FIG. 4. The substrate is provided with conventional heavily doped n+ and p+ buried layers and overlying well regions are defined in a conventional manner. For example, the wafer is selectively masked and implanted with n or type dopant, to form respectively a heavily doped $n^+$ layer 36 and a p+ layer (not shown). Then an overlying epitaxial layer (epi-layer) of silicon is then deposited overall. This layer is selectively implanted to form an n well regions, e.g. n well region 38 in FIG. 4, and p well regions (not shown), which are self-aligned with the corresponding underlying n+ or p+ buried layers, respectively.

Field isolation regions 39 are defined in the surface by a known process, e.g. by a LOCOS type process, or by forming shallow trench isolation. Thus conventional n and p device well regions are defined in the substrate surface for formation of bipolar transistors, MOS FETs, GCLBJTs or other devices, as required.

In particular, part of the substrate comprising an n well region 38, overlying a buried layer 38 for formation therein of the GCLBJT 30 is shown schematically in FIG. 4.

Figure 7:
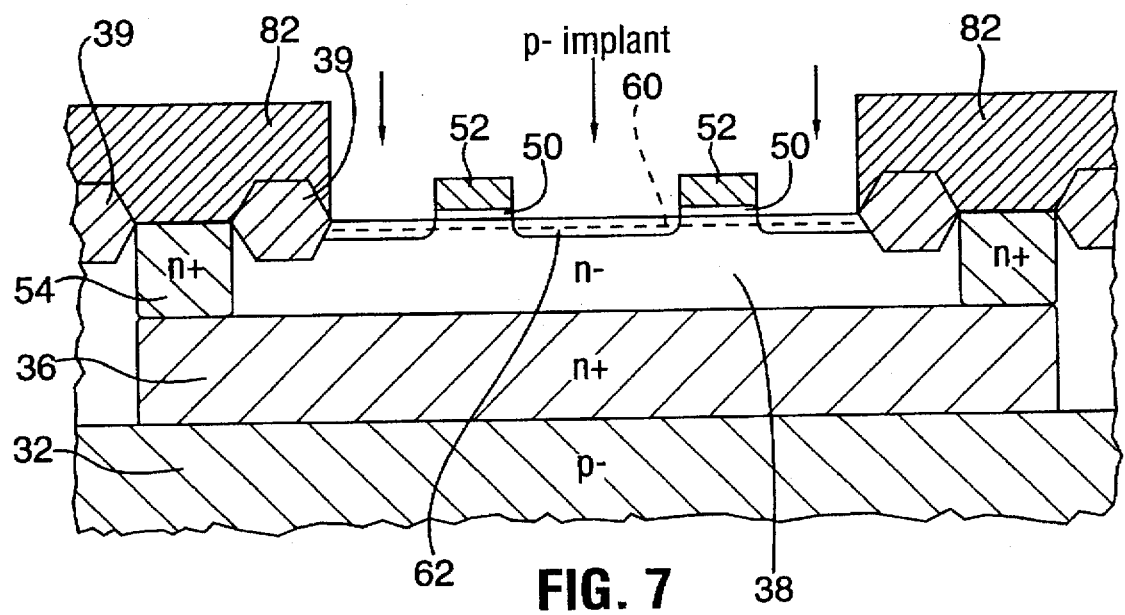
Figure 8:
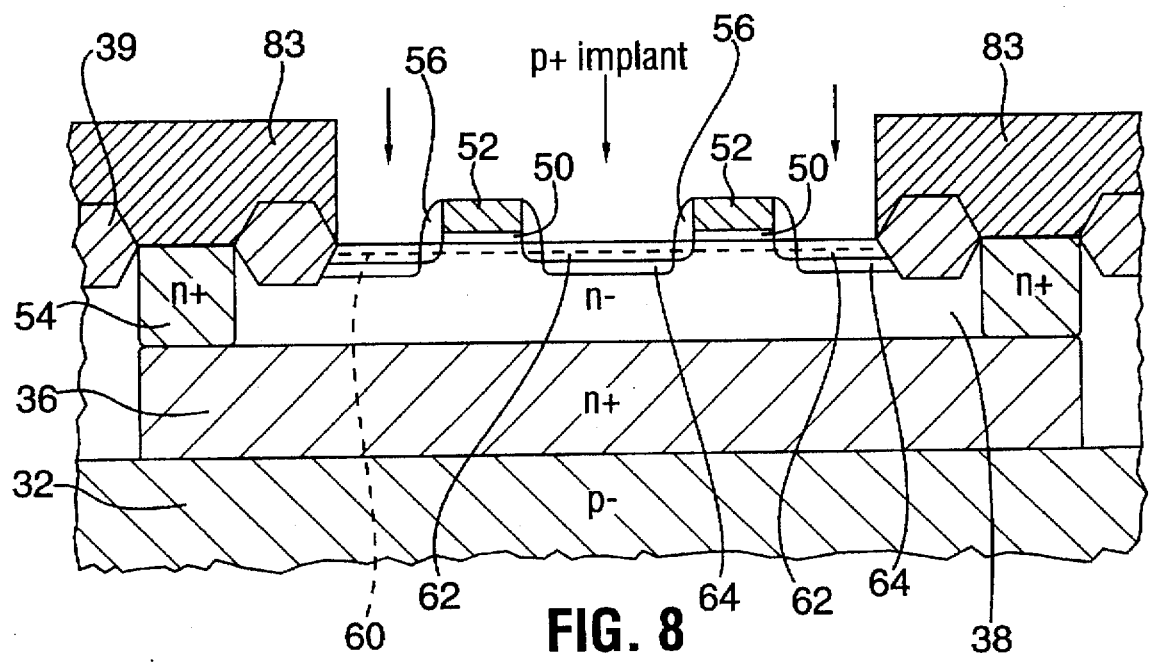

Successive steps for forming a pnp type GCLBJT according to the embodiment, in a n well region of the substrate, are shown in FIGS. 4 to 9. After selectively masking the surface a n+ sinker implant is performed into region 54 and annealed, to form the sinker contact 54 contacting the underlying heavily doped buried layer 36 (FIG. 4). The substrate is selectively masked with photoresist 80 to expose the device well region and a $V_t$ (threshold adjust) implant is performed into the surface region 60 (FIG. 5), i.e. a very shallow, low dose p type implant. After stripping the masking layer, a layer 50 of gate dielectric is provided overall, either by deposition or by oxidation of the silicon surface. Then a conductive layer 52, is deposited thereon. The conductive layer 52 is selectively masked and the conductive layer and underlying gate oxide are patterned to defined a gate electrode 52 of the GCLBJT, and underlying gate oxide 50, as shown in FIG. 7. The latter conductive layer typically comprises a layer of heavily doped polysilicon. Typically the polysilicon layer also form parts of other structures, e.g. capacitor electrodes in other parts of the integrated circuit (not shown). A p– implant is then performed in surface regions 62 in which emitter and collector regions of the GCLBJT will be defined, that is a p– implant into surface regions 62 adjacent, and self aligned, with the gate electrodes. An oxide layer is deposited overall and anisotropically etched to define sidewall spacers 56 on sidewalls of the gate electrode 52. After selective masking, a deeper p+ implant into regions 64 (FIG. 8) is performed. The latter implants are activated by a rapid thermal anneal process to reduce diffusion in the substrate, to provide structures as shown in FIG. 8, comprising a heavily p doped emitter region 44, and heavily p doped collector 46 encircling the emitter, with the base regions 48 extending between the emitter 44 and collector 46. The doping profile under the sidewall spacers 56 of the gate electrode 52 is characterized by relatively shallow and lightly p-doped implanted regions 43 in the surface regions adjacent and contiguous with the heavily p doped emitter 44 and collector 46. These lightly p doped regions 43 are shown schematically in FIG. 9 and resemble an LDD type doping profile typical of MOSFETs. The shallow surface regions 49 are selectively lightly p doped to provide control of the threshold voltage for the surface MOS channel formed through the surface region of the base 48 under the gate electrode, extending between the emitter (i.e. source) and collector (i.e. drain). Contacts to the emitter, collector, and gate electrodes are provided in a conventional manner. Beneficially the contact regions are silicided to reduce contact resistance.

Thus the structure of the GCLBJT 30 is characterized by a base region having a $V_t$ adjust implant in the surface region 49 to control the gate voltage at which the surface MOS channel turns on, and the lightly p doped surface regions 43 adjacent the emitter and collector which reduce the effective channel length of the device, i.e. similar to LDD technology. These lightly doped regions 43 also result in a reduced base width of lateral PNP with beneficial effects on the characteristics of the GCLBJT as will be explained in the section on operation of the device below.

The embodiment described above relates to the formation of a PNP GCLBJT. As will be appreciated, a lateral NPN GCLBJT may be formed by similar method steps, starting with an n-type substrate and then forming respective elements of appropriate opposite conductivity types.

The above described method steps are compatible with known BiCMOS process technologies.

Figure 9:
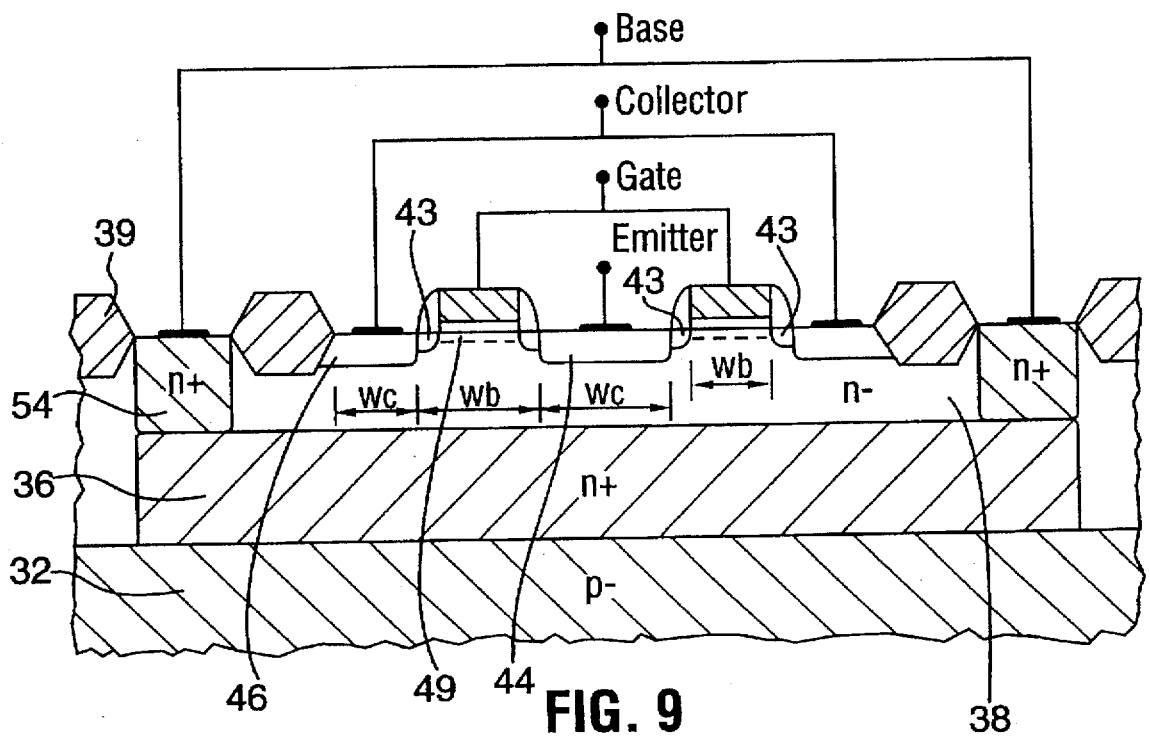

For example, the polysilicon layer 52 forming gate electrodes of the GCLBJT typically may form other structures of an integrated circuit devices including gate electrodes of MOSFETs, and capacitor electrodes. Self-aligned n– and p– implants are then performed in surface regions defining the source and drain regions of p channel and n channel MOSFETs respectively, and in the emitter and collector regions of GCLBJTs as appropriate. The latter implants form part of the LDD dopant profile of MOSFETs. After deposition overall of the oxide layer for forming the sidewall spacers or gate electrodes of MOSFETs and GCLBJTs the oxide may be patterned to form emitter openings for bipolar transistors, and emitter poly silicon is deposited overall and then patterned to define emitter structures, and if required, parts of other structures, e.g. poly resistors. The anisotropic oxide etch then forms the dielectric sidewall spacers 56 on the GCLBJT as well as on sidewalls of gate electrodes of MOSFETs and on sidewalls of emitters of vertical bipolar transistors. Typically the polysilicon layer also form parts of other structures, e.g. capacitor electrodes in other parts of the integrated circuit (not shown). After selective masking, selective n+ implant are performed for source and drain regions of p MOSFETs, and then a corresponding selective p+ implants for source/drain regions for n-MOSFETs and for emitter and collector implants for the GCLBJTs as shown in FIG. 8. All the latter implants are activated by a rapid thermal anneal process to reduce diffusion in the substrate. The resulting structures thus are characterized by a similar LDD like doping profiles under the sidewall spacers of the gate electrodes in both the MOSFETs (not shown) and in the GCLBJTs, i.e. as shown in FIG. 9, with heavily doped emitter and collector regions 44 and 46 respectively, and shallower lightly doped regions 43 in the surface adjacent the emitter 44 and collector 46.

Theory of operation

Although the GCLBJT device described above may be envisioned as similar to a p-channel, metal-oxide-semiconductor field-effect transistor (p-MOSFET) in construction, by virtue of the fourth terminal, its operation is somewhat different. Consider, for example, a technology employing a threshold adjust implant in the construction of p-channel MOSFET transistor. The threshold adjust implant serves to specify the required voltage applied to the gate in order to create a low impedance inversion channel linking source and drain. It is possible with the threshold implant to create a PMOS with a threshold voltage of zero volts (a so-called depletion mode device). Thus, a potential on the gate is required, in fact, to turn the field-effect transistor 'off' and re-establish a high impedance path between source and drain terminals. Thus, in employing PMOS devices from this technology as lateral bipolar transistors, it is necessary to bias the gate in order to avoid shorting the emitter to the collector. A positive bias on the gate drives free holes from the interface between gate oxide and silicon surface, and thereby destroys the low conductivity path between emitter and collector. The lateral bipolar transistor can then operate in a conventional manner with no regard to MOSFET behavior. However, with a larger positive potential on the gate, the path taken by holes injected from the emitter moves deeper into the bulk of the silicon under the gate. In effect, the lateral bipolar transistor properties and performance metrics (which are dependent upon the path of minority carriers) are now also dependent upon the gate bias.

Thus key differences in operation of the GCLBJT described above and a conventional lateral PNP transistor is that a voltage is applied to the additional gate electrode formed above the base region. The electrode spans the base region between the emitter and collector regions, and provides for control of the collector current path through the base region.

A number of transistor parameters are affected by gate bias. These include bipolar transistor gain, frequency response, and noise properties. The behavior of these parameters with respect to gate bias are discussed below.

Based on the device structure and measured I–V curves, the device can be visualized as identical to PMOS device (source/gate/drain) in parallel with a lateral PNP BJT (emitter/base/collector).

The effect of the gate voltage on the merged PMOS/lateral BJT device characteristics can be explained qualitatively as follows, by considering three regions of operation.

1. When the gate voltage $V_{gs}$ is larger than the flat band potential $V_{fb}$, typically, $V_{fb} > 0.0$ V for a PMOS transistor, an accumulation n-layer is formed under the gate. Thus the PMOS device is turned off, and only the pure lateral BJT transistor is operational. The thickness of the accumulation layer is very thin, i.e. 2 to 3 $L_D$, where $L_D$ Debye length, that is, approximately 40 nm for holes at room temperature. The accumulation layer is substantially independent of gate voltage variation In comparison with a conventional lateral PNP, however, the accumulation layer near the surface under the gate, influences the path of the collector current $I_c$. Thus the collector current path, i.e. the path of mobile holes injected from the emitter, is moved deeper into the bulk of the base region under the gate. This has a beneficial effect, that is, interfacial oxide scattering under the gate is reduced resulting in reduced flicker noise.

2. When the gate voltage is between $V_{fb}$ and the threshold voltage $V_t$, a wider depleted layer is formed under the gate and the PMOS device operates in weak inversion. The thickness of the depletion layer is strongly dependent on the voltage across the gate and base region. The depletion depth may extend through the whole depth of emitter/base and base/collector junction depth. Thus the lateral PNP device characteristics will be a strong function of the gate voltage. However the low flicker noise is maintained, as described above for $V_{gs} > V_{fb}$.

3. When $V_{gs}$ is larger than the $V_t$ (i.e. in absolute value) an inversion p layer is formed under the gate electrode and the device acts predominantly as a PMOS FET transistor rather than a bipolar transistor. This region is of least interest in the present application.

Thus in the following examples, operation of the four terminal GCLBJT takes advantage of the strong dependence of the collector current on the gate voltage when $V_g < V_t$, i.e.

when the device is predominantly behaving as a lateral bipolar transistor, with the PMOS channel effectively off. Nevertheless, even when the PMOS channel is of, the gate voltage functions to modulate the current path of the collector current through the base region, i.e. in the substrate region underlying the gate electrode, which has a significant effect on the gain, band width, transconductance, and noise characteristics of the device Benefits for Circuit Design The semiconductor device presented in this application allows designers to create a transistor which may be optimized within a range of performance specifications simply by biasing the gate. Use of a four terminal GCLBJT device as a transistor with configurable performance metrics has far reaching implications on circuit design. The GCLBJT structure is suitable for various analog circuits on a chip where tunable gain, tunable transition frequency and tunable low frequency noise is required to optimize a design.

Noise Properties

The modulation of the minority current path from emitter to the collector by application of a gate voltage has a profound effect on the noise properties of the transistor. Noise is significantly reduced as minority current flows deeper in the bulk of the transistor. This phenomenon may be attributed to reduced interfacial oxide scattering of the minority carriers or a net reduction in generation-recombination sites associated with the interface. Our studies have shown that modulation of current path results in a significant and important measured result.

The low frequency noise in these lateral pnp devices are significantly lower than in either vertical npn's or pnp's fabricated in the same technology. On the other hand, when the lateral pnp is configured as a p-MOSFET, its noise current is similar to that of a regular PMOS under similar biasing conditions. The flicker noise corner frequency of the lateral pnp is measured to be typically about 20 Hz for wide range of base biasing conditions in the 'IDEAL' Gummel characteristics.

Figure 10:
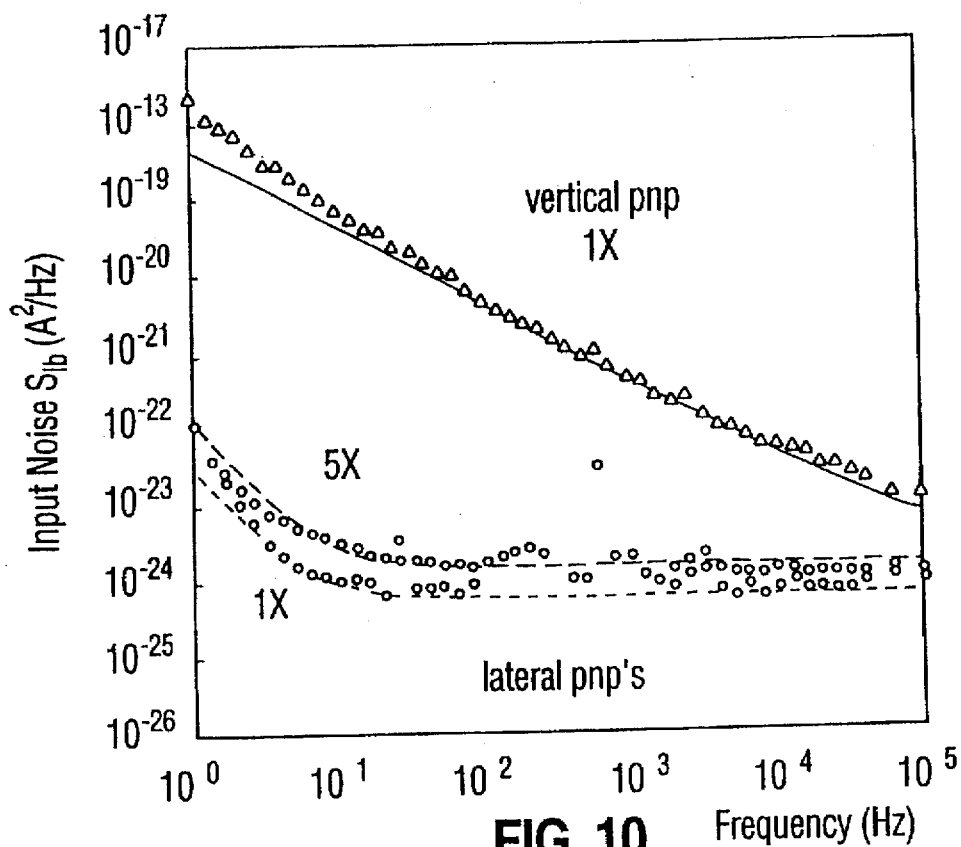
FIG. 10 shows input referred current noise power vs. frequency for two isolated lateral bipolar transistors according to the embodiment and a conventional non isolated pnp vertical bipolar transistor
Figure 11:
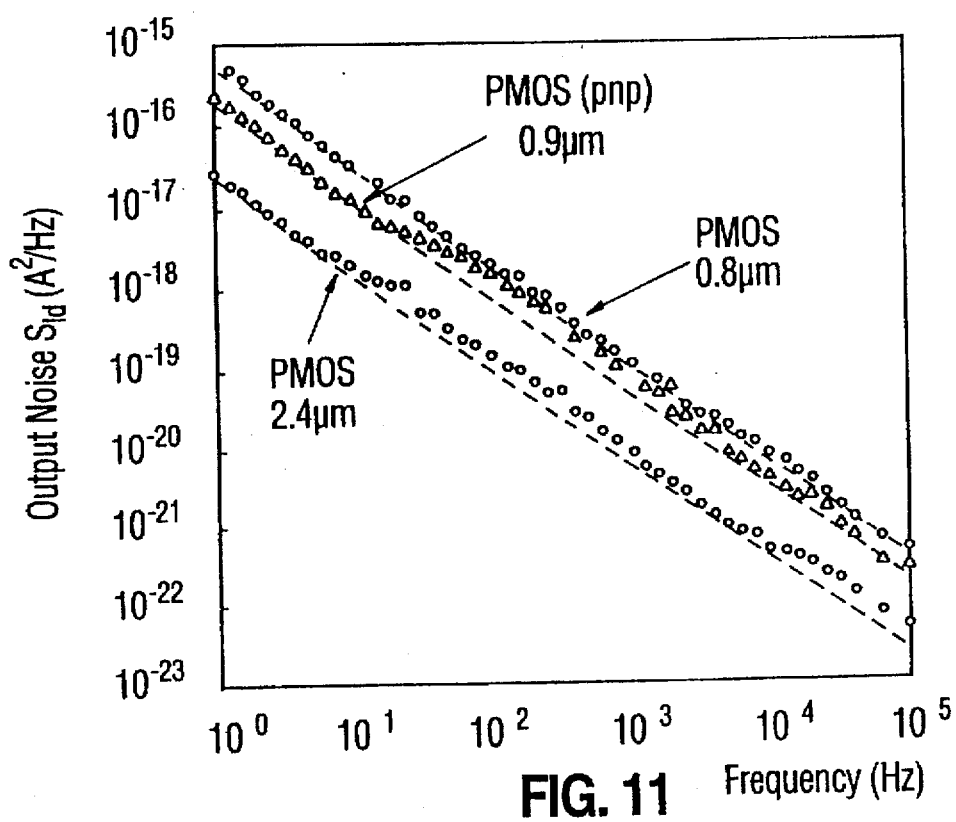
FIG. 11 shows output drain current noise power vs. frequency for two conventional PMOS transistors (0.8 μm and 2.4 μm channel length) and a PMOS transistor configured from the bipolar transistor according to the embodiment.

FIGS. 10 and 11 illustrate the low frequency noise comparison between lateral and vertical PNP BJTS and PMOS transistors.

The noise may be modeled as a summation of contributions from generation-recombination, flicker and shot noise sources using the equation below for output current noise spectral density.

$$S_{IB}(f) = \frac{K_F I_B^{A_F}}{f^\alpha} + \sum_{i=1}^{m} \frac{A_i \tau_i}{(1 + \omega^2 \tau_i^2)} + 2qI_B \qquad (1)$$

2

We list in the Table I values for $K_F$, $A_F$, and $\alpha$;. Where $S_{IB}$ (f) is noise spectral density in the base current, $\omega = 2\pi f$. and $A_F$, $\alpha$, and $K_F$ are SPICE model parameters which describe the dependence of the low frequency noise on the dc current and frequency.

TABLE I

Comparison of the noise parameters for devices studied. Note that the noise for the MOSFETs are output referred, but for the BJTs are input referred.

| Device | $K_F$ ($\mu m^{-2}$) | $A_F$ | $\alpha$ |
|---|---|---|---|
| PMOS (lateral pnp) | $(3.7 \pm 1.1) \times 10^{-10}$ | 2 | 1.2 |
| Regular PMOS | $(3.9 \pm 1.3) \times 10^{-10}$ | 2 | 1.2 |
| Lateral pnp | $(8.8 \pm 2.5) \times 10^{-14}$ | 1.45 | 2 |

TABLE I-continued

Comparison of the noise parameters for devices studied. Note that the noise for the MOSFETs are output referred, but for the BJTs are input referred.

| Device | $K_F$ ($\mu m^{-2}$) | $A_F$ | $\alpha$ |
|---|---|---|---|
| Vertical pnp | $(2.0 \pm 0.3) \times 10^{-8}$ | 2 | 1 |
| Vertical npn | $(7.2 \pm 1.5) \times 10^{-9}$ | 2 | 1 |

In comparison to the PMOS device, the lateral or the vertical bipolar devices exhibit less generation-recombination noise, primarily because they are bulk devices, rather than surface controlled devices (MOSFETs).

These results clearly indicate that a suitably biased lateral pnp BJT fabricated as described above would be a very good building block for the design of ultra-low noise analog circuits.

Effect on Common Emitter Gain and Unity Gain Frequency

As was stated above, the function of the GCLBJT four terminal device of the embodiment is similar to that of a p-MOSFET in parallel with lateral pnp transistor. Reducing the bias of the gate with reference to emitter will effectively turn "on" the MOSFET in parallel with lateral BJT and thereby increase collector current. In this mode of operation, holes travels a shorter path compared to the mode of operation when p-MOSFET is turned "off". Thus, low noise performance can be traded-off for larger gain simply by adjusting the gate potential. Turning the MOSFET 'on' not only gives higher gain but also improves the transit time of minority carriers from emitter to collector. A secondary result of this effect is a transistor with tunable unity-gain frequency. Transit time of minority carriers is the predominant limiting time constant in the frequency response of lateral bipolar transistors.

Thus a GCLBJT for an integrated circuit is provided in the form of a four terminal gain device operable as an electronically configurable lateral transistor. The device takes the form of a merged field effect transistor and lateral bipolar transistor, i.e. a lateral bipolar transistor having base, emitter and collector terminals and a fourth terminal controlling a gate electrode. The structure of the four terminal transistor is distinguished from a conventional MOSFET having a heavily doped source and drain region defining a channel region, by the additional deep, heavily doped base contact made to the buried layer in the same device well as the MOSFET like elements of the structure.

The structure of the device provides the inherent ability to have definitive performance parameters adjusted via a electronic signal to a fourth transistor terminal. Key transistor performance characteristics such as common-emitter current gain, unity-gain frequency, and the low frequency noise properties are all variable quantities which can be specified electronically, i.e. they are programmable. This concept is in sharp contrast to conventional three-terminal transistor technology where performance attributes are specified by the physical structure of the transistor and/or the layout of the integrated circuit. It is the concurrent usage of field effect and bipolar injection phenomenon within the same device that yield the salient device characteristics.

Figure 12:
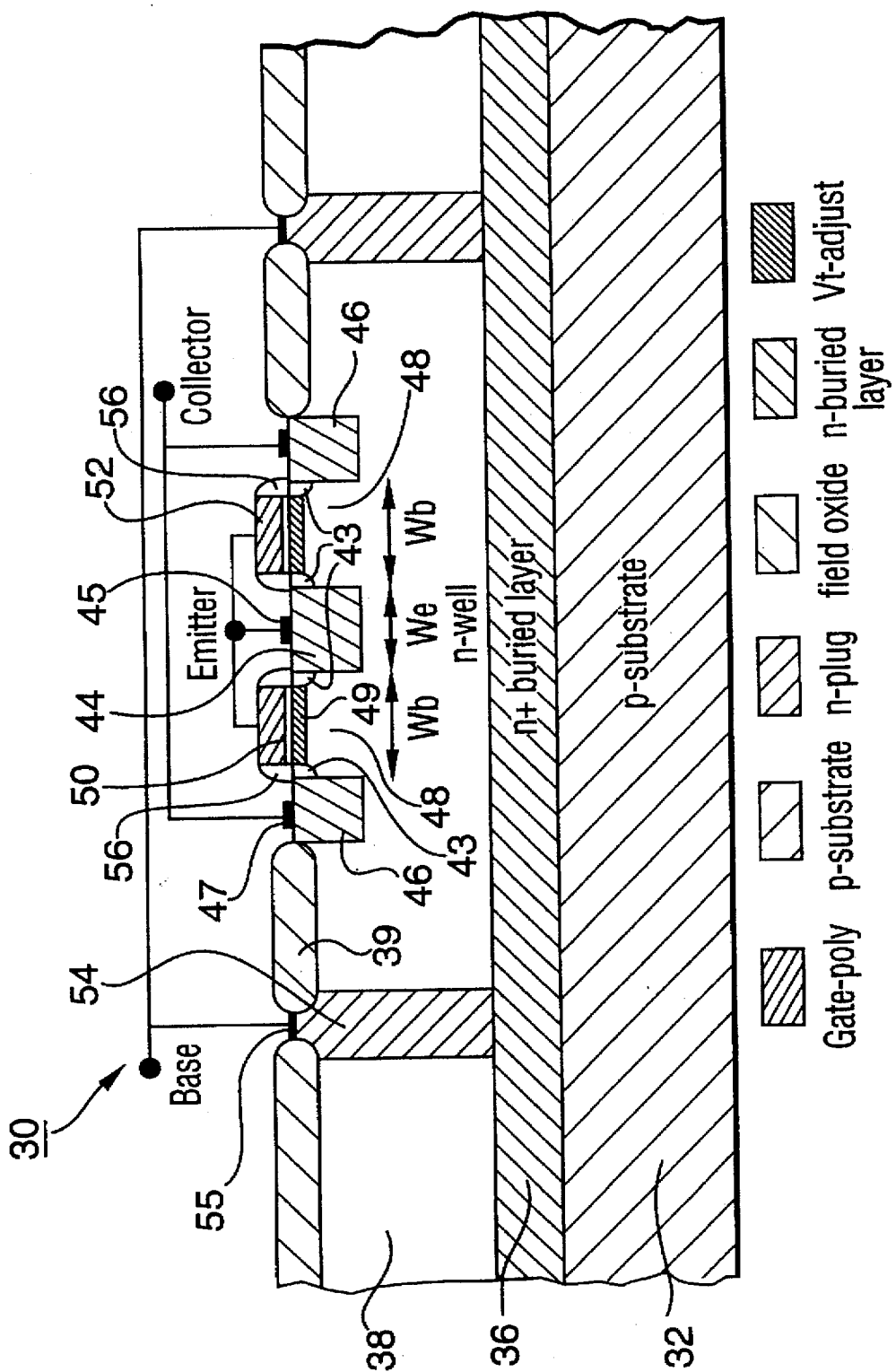
FIG. 12 shows a schematic cross-sectional view of through part of an integrated circuit device fabricated showing a semiconductor device according to a second embodiment of the present invention (i.e. emitter connected to gate).

A gate controlled lateral bipolar junction transistor structure according to a second embodiment of the present invention is shown in FIG. 12 in which the GCLBJT is configured alternatively for operation as a 3 terminal device. That is, the structure is identical to that of the first embodiment except that the gate electrode is connected to the emitter to ensure the surface MOSFET conduction channel is turned "off".

What is claimed is:

1. A gate controlled lateral bipolar junction transistor for an integrated circuit comprising:

a substrate comprising a layer of semiconductor material of a first conductivity type having a surface, and an underlying heavily doped buried semiconductor layer of the first conductivity type;

first and second laterally spaced apart regions of a second conductivity type defined in the surface of the semiconductor layer and forming an emitter and a collector of the transistor, part of the layer of semiconductor material of the first conductivity type extending laterally between the emitter and the collector and forming a base region of the transistor, and lightly doped regions of the second conductivity type being provided in parts of the surface between emitter and collector, adjacent and contiguous with the emitter and collector regions;

a gate electrode formed on the surface of the substrate overlying the base region and isolated therefrom by a gate dielectric; and the heavily doped buried layer of said first conductivity type extending under the emitter, base and collector regions and forming a buried base electrode with a heavily doped base contact extending from the surface to the buried layer;

first, second and third terminals being provided to the emitter, base and collector, for operation of the device as a bipolar transistor, and a fourth terminal being provided to the gate electrode for controlling surface inversion of a surface MOSFET channel provided by the base region under the gate electrode between emitter and collector regions, thereby providing for concurrent control of both field effect and bipolar injection phenomena in the base region during operation of the transistor with a potential on the gate electrode, for controlling a current path of minority carriers through the base region.

2. A transistor according to claim 1, wherein the gate electrode has sidewalls and comprising dielectric sidewall spacers formed on the sidewalls of the gate electrode, with the lightly doped regions of the second conductivity type extending thereunder.

3. A transistor according to claim 1 wherein a surface of the base region under the gate electrode is selectively doped to control a threshold voltage of the surface MOSFET channel.

4. A transistor according to claim 1 wherein the collector is of annular form and surrounds the emitter.

5. A transistor according to claim 4 wherein the base contact surrounds and encloses the collector, whereby the base contact and buried layer form an enclosed structure.

6. A gate controlled lateral bipolar junction transistor comprising:

a substrate comprising a surface layer of a semiconductor of a first conductivity type having formed thereunder a heavily doped buried layer of said first conductivity type forming a buried base electrode, and a base contact provided to the buried base electrode through the surface layer;

an emitter region and a collector region of a second conductivity type defined in the surface layer of the substrate overlying the base electrode, the emitter and collector regions being laterally spaced apart with an intervening region of the first conductivity type forming an active base region;

a gate electrode formed on the surface of the substrate over the active base region, and isolated therefrom by a layer of a gate dielectric;

first and second terminals being provided respectively to the emitter region and collector region, and a third terminal to a surface contact to the buried layer, for operation of the structure as a bipolar transistor, and, a fourth terminal being provided to the gate electrode for application of a potential for controlling field inversion in a MOS channel region formed in the surface under the gate electrode between emitter and collector regions;

thereby providing for concurrent control of both field effect and bipolar injection phenomena during operation of the transistor with a potential on the gate electrode for modifying the path of collector current through the base region during operation of the device as a bipolar transistor;

the base region under the gate electrode being characterized by a selectively doped very shallow surface region for controlling the threshold voltage of the MOS channel region; and shallow relatively lightly doped regions of a second conductivity type being provided in the surface region adjacent and contacting the emitter and collector regions to reduce both an effective base width and MOS channel length of the transistor.

7. A transistor according to claim 6 wherein the collector region has an annular form surrounding the emitter region, with the base region extending therebetween, and the gate electrode is also of annular form overlying the base region between emitter and collector.

8. A transistor according to claim 6 wherein the base contact surrounds the collector, whereby the base contact and the buried layer form an enclosed structure.

* * * * *